United States Patent
Kim et al.

(10) Patent No.: US 10,693,472 B2
(45) Date of Patent: Jun. 23, 2020

(54) METHOD AND APPARATUS FOR GENERATING CLOCK

(71) Applicant: SAMSUNG ELECTRONICS CO., LTD., Suwon-si, Gyeonggi-Do (KR)

(72) Inventors: Seung-jin Kim, Hwaseong-si (KR); Jong-woo Lee, Seoul (KR); Min-gyu Jo, Hwaseong-si (KR); Byung-ki Han, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/282,472

(22) Filed: Feb. 22, 2019

(65) Prior Publication Data
US 2019/0348988 A1    Nov. 14, 2019

(30) Foreign Application Priority Data
May 9, 2018    (KR) .................. 10-2018-0053206

(51) Int. Cl.
*H03L 7/089* (2006.01)
*H03L 7/08* (2006.01)
(Continued)

(52) U.S. Cl.
CPC ............ *H03L 7/089* (2013.01); *H03L 7/0805* (2013.01); *H03L 7/0998* (2013.01); *H03L 7/18* (2013.01)

(58) Field of Classification Search
USPC .................. 327/147–149, 156–158
See application file for complete search history.

(56) References Cited

U.S. PATENT DOCUMENTS 6,167,245 A * 12/2000 Welland .................. H03L 7/085
                                                              331/360
7,042,253 B2 * 5/2006 Su .......................... H03L 7/099
                                                              327/11
(Continued)

FOREIGN PATENT DOCUMENTS

KR    1020120100248    9/2012
KR    10-1861215      4/2018

OTHER PUBLICATIONS

Dongmin Park, et al. "A 14.2 mW 2.55-to-3 GHz Cascaded PLL With Reference Injection and 800 MHz Delta-Sigma Modulator in 0.13μm CMOS", IEEE Journal of Solid-State Circuits, vol. 47, No. 12, Dec. 2012, pp. 2989-2998.
(Continued)

*Primary Examiner* — Adam D Houston
(74) *Attorney, Agent, or Firm* — F. Chau & Associates, LLC

(57) ABSTRACT

A clock generation apparatus includes a pulse generator configured to generate a pulse signal and a selection signal using a reference clock signal, a delay line circuit, a switch and a controller. The delay line circuit selects, as an input signal to a delay path, the pulse signal or a fed back portion of a delay clock signal at an output of the delay path, where the selection is based on the selection signal; and thereby generates the delay clock signal. The switch switches a first voltage or a second voltage to the delay line circuit for its operation, where the first voltage further provides power to the pulse generator. The second voltage is generated based on a phase difference between the reference clock signal and the delay clock signal. The controller generates a switch control signal based on a frequency of the delay clock signal.

22 Claims, 12 Drawing Sheets

(51) Int. Cl.
*H03L 7/099* (2006.01)
*H03L 7/18* (2006.01)

(56) References Cited

U.S. PATENT DOCUMENTS

| | | | |
|---|---|---|---|
| 7,372,310 B2 | 5/2008 | Lee | |
| 7,375,595 B2* | 5/2008 | Serrano | H03L 7/0898 331/16 |
| 7,474,159 B2* | 1/2009 | Wang | H03L 7/099 331/16 |
| 7,495,489 B2 | 2/2009 | Wu et al. | |
| 7,546,097 B2* | 6/2009 | Dunworth | H03L 7/0898 455/124 |
| 7,994,832 B2 | 8/2011 | Ali et al. | |
| 8,487,707 B2* | 7/2013 | Wang | H03L 7/087 327/150 |
| 8,519,757 B2* | 8/2013 | Oh | H03L 7/102 327/148 |
| 8,536,915 B1 | 9/2013 | Terrovitis | |
| 8,791,764 B2 | 7/2014 | Shin et al. | |
| 9,071,253 B2* | 6/2015 | Li | H03B 1/00 |
| 9,413,366 B2* | 8/2016 | Shanan | H03L 7/099 |
| 9,484,935 B2* | 11/2016 | Shanan | H03L 7/099 |
| 9,614,537 B1 | 4/2017 | Nandwana et al. | |
| 9,786,353 B2 | 10/2017 | Mansuri et al. | |
| 9,935,640 B1* | 4/2018 | Chan | H03L 7/099 |
| 2002/0036545 A1* | 3/2002 | Fridi | H03L 7/099 331/17 |
| 2004/0125905 A1 | 7/2004 | Vlasenko et al. | |
| 2005/0046497 A1 | 3/2005 | Nakanishi | |
| 2006/0158235 A1* | 7/2006 | Zachan | H03L 7/0893 327/156 |
| 2006/0158264 A1* | 7/2006 | Kousai | H03L 7/099 331/16 |
| 2006/0220757 A1* | 10/2006 | Satake | H03L 7/099 331/179 |
| 2007/0152715 A1 | 7/2007 | Park | |
| 2008/0036544 A1* | 2/2008 | Wang | H03L 7/093 331/16 |
| 2010/0090768 A1* | 4/2010 | Yamazaki | H03L 7/099 331/15 |
| 2011/0227615 A1* | 9/2011 | Faison | H03L 7/099 327/157 |
| 2011/0260763 A1* | 10/2011 | Wang | H03L 7/087 327/157 |
| 2011/0316595 A1* | 12/2011 | Bolton | H03L 1/022 327/156 |
| 2014/0118042 A1* | 5/2014 | Searles | H03L 7/0812 327/158 |
| 2014/0203854 A1* | 7/2014 | Jung | H03L 7/0802 327/158 |
| 2014/0340132 A1* | 11/2014 | Terrovitis | H03L 7/08 327/157 |
| 2014/0347105 A1* | 11/2014 | Rozenblit | H03L 7/08 327/156 |
| 2015/0054555 A1* | 2/2015 | Berkram | H03L 7/0812 327/158 |
| 2015/0263741 A1* | 9/2015 | Li | H03B 1/00 327/156 |
| 2015/0303930 A1* | 10/2015 | Chen | H03L 7/24 327/156 |
| 2016/0087640 A1* | 3/2016 | Zhang | H03L 7/097 327/158 |
| 2017/0324418 A1* | 11/2017 | Kao | H03L 7/18 |
| 2017/0366191 A1 | 12/2017 | Wang et al. | |

OTHER PUBLICATIONS

Ramin Farjad-Rad et al., "A low-power multiplying DLL for low-jitter multigigahertz clock generation in highly integrated digital chips," IEEE J. Solid-State Circuits, vol. 37, No. 12, Dec. 2002pp. 1804-1812.

Wei Deng, et al., "A 0.00661mm2 780μW Fully Synthesizable PLL with a Current-Output DAC and an Interpolative Phase-Coupled Oscillator using Edge-Injection Technique," ISSCC Dig. Tech. Papers, Feb. 2014, pp. 266-267.

Dongmin Park et al., "A 14.2mW 2.55-to-3GHz cascaded PLL with reference injection, 800MHz delta-sigma modulator and 255fsrms integrated jitter in 0.13μm CMOS," ISSCC Dig. Tech. Papers, Febuary 2012, pp. 344-345.

European Search Report dated Oct. 14, 2019 in corresponding European Patent Application No, 19169227.6 (9 pages).

* cited by examiner

METHOD AND APPARATUS FOR GENERATING CLOCK

CROSS-REFERENCE TO RELATED APPLICATION

This application claims the benefit of Korean Patent Application No. 10-2018-0053206, filed on May 9, 2018, in the Korean Intellectual Property Office, the disclosure of which is incorporated herein by reference in its entirety.

TECHNICAL FIELD

The inventive concept relates generally to clock generation and more particularly to a method and apparatus for generating a desired clock signal from a reference clock signal.

DISCUSSION OF THE RELATED ART

An integrated circuit operation involving the processing of digital signals may be synchronized to a clock signal. An integrated circuit may also use a dock signal to process an analog signal, such as a signal in a radio frequency (RF) range. When the frequency and volume of signals processed by an integrated circuit increase, a higher frequency clock signal may be utilized to carry out the processing operations. If clock jitter is generated in the clock signal, this may degrade a high-speed operation of the integrated circuit.

SUMMARY

The inventive concept provides a method and an apparatus for generating a clock having reduced jitter by preventing noise effects which may otherwise cause jitter.

According to an aspect of the inventive concept, there is provided a clock generation apparatus including: a pulse generator configured to generate a pulse signal and a selection signal using a reference clock signal; a delay line circuit; a switch; and a controller. The delay line circuit is configured to select, as an input signal to a delay path, the pulse signal or a fed back portion of a delay clock signal at an output of the delay path, where the selection is based on the selection signal; and thereby generate the delay clock signal. The switch is configured to switch, based on a switch control signal, a first voltage or a second voltage to the delay line circuit for operation thereof, where the first voltage further provides power to the pulse generator, and the second voltage is generated based on a phase difference between the reference clock signal and the delay clock signal, The controller is configured to generate the switch control signal based on a frequency of the delay dock signal.

According to another aspect of the inventive concept, there is provided a clock generation apparatus including a pulse generator configured to generate a pulse signal including an injection pulse synchronized to an edge of a reference clock signal, a delay line circuit including a series of delay cells each providing a delay varying based on a control voltage and a delay control signal, and configured to periodically delay the injection pulse to generate a delay clock signal, and a controller. The controller is configured to: adjust the delay control signal until a frequency error between a frequency of the delay clock signal and a target frequency falls within a predetermined range in a time period in which the control voltage is a first voltage that also provides power to the pulse generator; and thereafter, maintain the delay control signal at a last adjusted value during a time period in which the control voltage is a second voltage generated based on a phase difference between the reference clock signal and the delay clock signal, so that the frequency of the delay clock signal is further adjusted towards the target frequency.

According to another aspect of the inventive concept, there is provided a method of generating a clock, the method including generating a pulse signal and a selection signal using a reference clock signal; selecting one of the pulse signal and a fed back portion of a delay clock signal based on the selection signal; generating the delay clock signal by passing the selected signal through a series of delay cells; in a coarse tuning period, providing a first voltage, which is a constant voltage, to the series of delay cells, and adjusting a delay of the series of delay cells until a frequency error between a frequency of the delay clock signal and a target frequency falls within a pre-determined range; and in a fine tuning period, generating a second voltage based on a phase difference between the reference clock signal and the delay clock signal, and providing the second voltage to the series of delay cells.

According to still another aspect, a delay locked loop circuit includes a pulse generator configured to generate pulses referenced to edges of a reference clock signal; a delay line circuit including a delay path with an adjustable delay for adjusting a frequency of an output clock signal, where the pulses are periodically applied to the delay path; a switch; and a controller. The switch is configured to switch, based on a switch control signal, a first voltage or a second voltage as a control voltage to the delay line circuit for controlling the adjustable delay, where the first voltage further provides power to the pulse generator, and the second voltage is variable based on a phase difference between the reference clock signal and a feedback signal derived from the output clock signal. The controller is configured to vary the switch control signal based on a frequency of the output clock signal.

BRIEF DESCRIPTION OF THE DRAWINGS

Embodiments of the inventive concept will be more clearly understood from the following detailed description taken in conjunction with the accompanying drawings in which like reference characters designate like elements or functions, wherein.

DETAILED DESCRIPTION OF EMBODIMENTS

Figure 1:
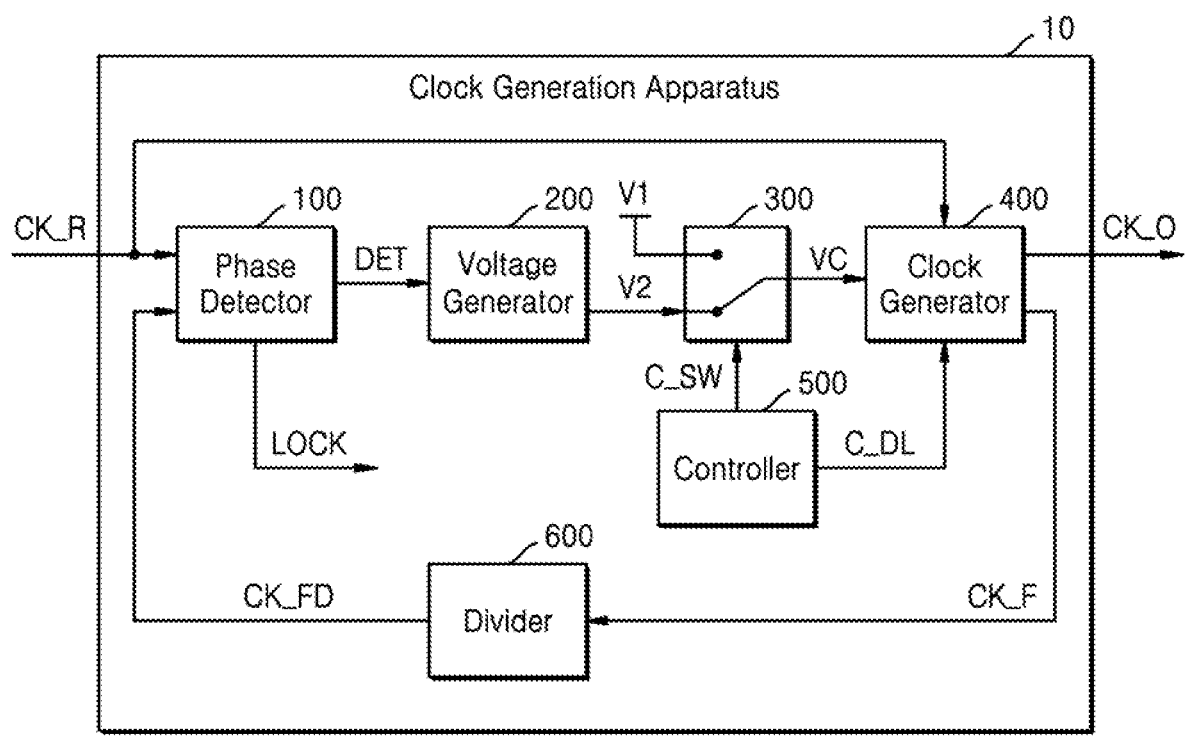
FIG. 1 is a block diagram of a clock generation apparatus according to an example embodiment.

FIG. 1 is a block diagram of a clock generation apparatus, 10, according to an example embodiment. The clock generation apparatus 10 may include a phase detector 100, a voltage generator 200, a switch 300, a clock generator 400, a controller 500, and a divider 600. In some embodiments, the clock generation apparatus 10 may be implemented entirely as an integrated circuit manufactured by using a semiconductor process, and in other embodiments, may include at least one semiconductor package including an integrated circuit and a board on which the semiconductor package is mounted.

The clock generation apparatus 10 may generate an output clock signal CK_O from a reference clock signal CK_R. The reference clock signal CK_R may oscillate based on a constant frequency, and may be generated, for example, from a crystal oscillator. The output clock signal CK_O may have a target frequency (e.g., f_OUT of FIG. 2A) within a desired range for operations by a function block to which the output clock signal CK_O is provided.

Hereafter, for brevity, any signal, voltage or other variable may be referred to interchangeably just by its previously introduced legend. For example, the output clock signal CK_O may be referred to as just "CK_O"; the reference clock signal CK_R may be referred to as just "CK_R"; a voltage V1 may be referred to as just "V1"; etc.

The function block may process a signal based on CK_O, where a signal processing speed of the function block may be dependent on the frequency of CK_O, but jitter of CK_O may limit a high speed operation of the function block. As described below, the clock generation apparatus 10 according to example embodiments of the inventive concept may generate CK_O having less jitter, by preventing noise effects that otherwise cause jitter while CK_O is generated.

The phase detector 100 may receive the reference clock signal CK_R from a source externa) of the clock generation apparatus 10 and receive a "divided clock signal" CK_FD which is a clock signal divided by the divider 600. The phase detector 100 may detect a phase difference between the reference clock signal CK_R and the divided clock signal CK_FD and generate a detection signal DET corresponding to the detected phase difference. For example, as described below with reference to FIG. 8, the detection signal DET may include an up signal and a down signal, and the phase detector 100 may activate the up signal and/or the down signal based on a sign of the phase difference between CK_R and CK_FD.

In some embodiments, the phase detector 100 may detect whether a loop including the phase detector 100, the voltage generator 200, the switch 300, the clock generator 400, and the divider 600 is locked. When the frequency of CK_O, or that of a feedback clock signal CK_F, which may be the same frequency as CK_O. has been maintained at the target frequency, the loop may be considered locked. For example, the phase detector 100 may generate an activated lock signal LOCK when a phase of CK_R and a phase of CK_FD are equal or have a constant difference from each other.

The voltage generator 200 may receive the detection signal DET from the phase detector 100 and generate a second voltage V2 based on DET. The second voltage V2 may have a magnitude dependent on the phase difference indicated by DET. For example, the voltage generator 200 may include a charge pump, a loop filter, a voltage buffer, etc., and when the phase of the divided clock signal CF_FD is relatively lagging, the voltage generator 200 may increase V2, and when the phase of CF_FD is relatively leading, the voltage generator 200 may decrease V2. Thus, the voltage generator 200 may generate V2 at a constant magnitude in a state in which the loop is locked. An example of the voltage generator 200 will be described below with reference to FIG. 8.

The switch 300 may supply a first voltage V1 or the second voltage V2 to the clock generator 400 as a control voltage VC based on a switch control signal C_SW. V1 is a constant voltage and may be provided from a source external of the clock generation apparatus 10. In some embodiments, V1 may be a positive supply voltage supplying power to a logic circuit for processing a digital signal external to the clock generation apparatus 10. As described below with reference to FIGS. 2A and 2B, based on the switch control signal C_SW, the switch 300 may supply V1 to the clock generator 400 as the control voltage VC in a coarse tuning time period, and supply V2 to the clock generator 400 as the control voltage VC in a fine tuning time period.

The clock generator 400 may receive VC from the switch 300 and receive a delay control signal C_DL from the controller 500. The clock generator 400 may generate an internal oscillation signal (for example, CK_D of FIG. 3) having a frequency dependent on VC and C_DL, and may generate CK_O and CK_F from the internal oscillation signal. C_DL may be a digital signal including at least one bit, and a frequency of the internal oscillation signal may be controlled as the clock generator 400 provides a delay to the internal oscillation signal based on a value of C_DL.

The clock generation apparatus 10 may be a multiplying delay locked loop (MDLL) circuit, which is a type of delay locked loop (DLL). An MDLL may generate an output clock signal having a frequency that is a multiple of a reference clock signal frequency, e.g. a multiple of an integer N, where N is two or higher. In general, an MDLL may operate by periodically injecting an edge of a reference clock into an output clock generator to reduce overall jitter by preventing accumulation of jitters. As described below with reference to FIG. 3, the clock generator 400 may improve jitter characteristics of the output clock signal CK_O by periodically injecting an edge of the reference clock signal CK_R into the internal oscillation signal. Further, in accordance with the inventive concept, to prevent a phenomenon in which locking of the loop is interrupted because the edge of CK_R is delayed when injected into the internal oscillation signal, a clock signal in which the edge is injected and a clock signal for locking the loop may be separated from each other. For example, CK_O may have a frequency dependent on the internal oscillation signal and may include an edge periodically injected from CK_R, while the feedback clock signal CK_F may have the same frequency as CK_O, but may not include the edge injected from CK_R.

The controller 500 may provide the switch control signal C_SW to the switch 300 and may provide the delay control signal C_DL to the clock generator 400, based on the frequency of CK_O (which may be the same frequency as the internal oscillation signal or CK_F of the clock generator 400). As described below with reference to FIGS. 2A and 2B, the controller 500 may generate the switch control signal C_SW such that the first voltage V1, which is a constant voltage, is provided to the clock generator 400 as the control voltage VC in the coarse timing period, and the second voltage V2 of the voltage generator 200 is provided to the clock generator 400 in the fine tuning period. Also, the controller 500 may generate the delay control signal C_DL to adjust a delay of delay cells included in the clock generator 400 during the coarse tuning period, and may maintain a value of C_DL during the fine tuning period at a last adjusted value.

In some embodiments, the clock generator 400 may generate a signal (for example, PUL and SEL of FIG. 3) for periodically injecting the edge of the reference clock signal CK_R by using power provided from the first voltage V1. However, "power noise" may occur as power associated with the first voltage V1 is delivered, and jitter of CK_O (or the internal oscillation signal) may increase due to the power noise. As mentioned above, the controller 500 may prevent such power noise effects that may occur in association with the first voltage V1, by commanding the application of the second voltage V2 as the control voltage VC during the fine tuning period.

The divider 600 may receive the feedback clock signal CK_F from the clock generator 400 and provide the divided clock signal CK_FD divided from CK_F to the phase detector 100. For example, the divider 600 may divide CK_F based on a ratio of a frequency of the reference clock signal CK_R to a target frequency of CK_O.

Figure 2A:
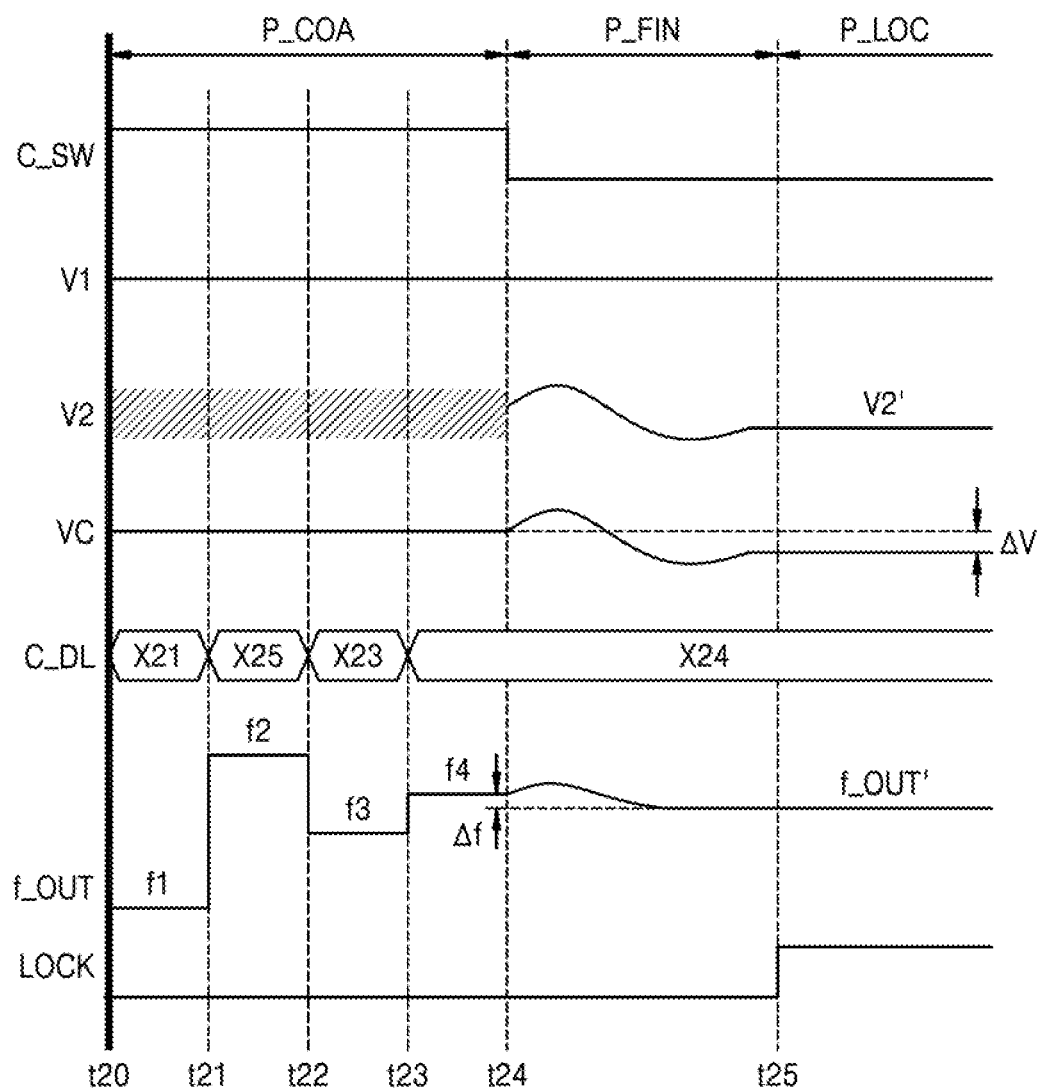
FIGS. 2A and 2B show an operation of the clock generation apparatus illustrated in FIG. 1, according to an example embodiment.
Figure 2B:
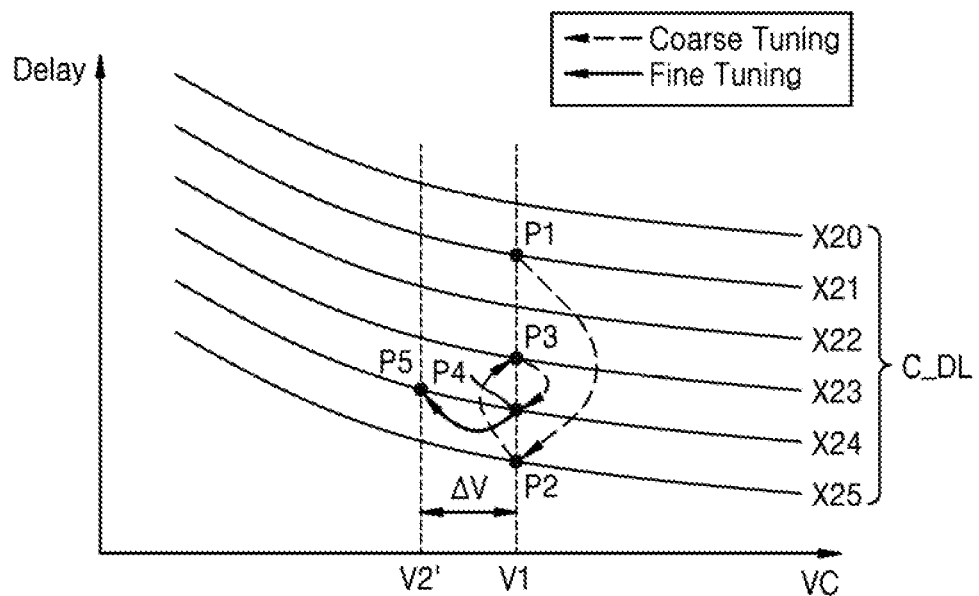

FIGS. 2A and 2B show an operation of the clock generation apparatus 10 of FIG. 1, according to an example embodiment. In particular, FIG. 2A is a timing diagram showing the operation of the clock generation apparatus 10 according to a flow of time, and FIG. 2B is a graph showing a delay of delay cells included in the clock generator 400 based on the control voltage VC and the delay control signal C_DL. Herein, a signal that is said to be "activated" may have a first logic voltage level, e.g., a high level, that represents a first signal state or command, whereas a signal said to be "non-activated" signal has a second logic level, e.g., a low level, representing a second signal state or command. Hereinafter, FIGS. 2A and 2B will be described with reference to FIG. 1.

Referring to FIG. 2A, the controller 500 may generate the switch control signal C_SW activated a time point t20, which controls the switch 300 to provide the first voltage V1, which is a constant voltage, to the clock generator 400 as the control voltage VC. Hence, the control voltage VC may have a constant magnitude which is substantially the first voltage V1. The switch control signal C_SW may be activated until a time point t24, and a time period in which the control voltage VC corresponds to V1 based on the activated switch control signal C_SW may be referred to as a coarse tuning period P_COA.

The controller 500 may set a frequency f_OUT of CK_O as a frequency (for example, f4 of FIG. 2A) that is closest to the target frequency f_OUT', by adjusting a value of the delay control signal C_DL during the coarse tuning period P_COA. In some embodiments, as illustrated in FIGS. 2A and 2B. the controller 500 may use binary searching of delay values to arrive at an optimum value for C_DL and set f_OUT using a successive approximation register (SAR). The searching method of the controller 500, illustrated in FIGS. 2A and 2B. is only an example, and the controller 500 may set the frequency f_OUT of CK_O by using various other searching methods. As described above, generation of CK_O having a desired frequency through the control of the delay control signal C_DL in a state in which the first (constant) voltage V1 is applied, may be referred to as automatic bias calibration (ABC).

The controller 500 may generate the delay control signal C_DL having a value X21 at the time point t20. Accordingly, as illustrated in FIG. 2B, the delay cells included in the clock generator 400 may provide a delay corresponding to a point P1 and the frequency f_OUT of CK_O may have a first frequency f1. At a time point t21, the controller 500 may generate the delay control signal C_DL having a value X25, and the frequency f_OUT of CK_O may have a second frequency f2, based on a delay corresponding to a point P2 of FIG. 2B. At a time point t22, the controller 500 may generate the delay control signal C_DL having a value X23, and the frequency f_OUT of CK_O may have a third frequency f3 based on a delay corresponding to a point P3 of FIG. 2B. At a time point t23, the controller 500 may generate the delay control signal C_DL having a value X24, and the frequency f_OUT of CK_O may have a fourth frequency f4 based on a delay corresponding to a point P4 of FIG. 2B.

A frequency error Δf may exist between the fourth frequency f4 and the target frequency f_OUT' of CK_O, where f4 is the best approximation of f_OUT' in the state in which the first voltage V1 is applied. The frequency error Δf may be dependent on a minimum unit of a delay provided by the delay cells included in the clock generator 400. To reduce the frequency error Δf between the fourth frequency f4 determined in the coarse tuning section P_COA and the target frequency f_OUT', the clock generator 400 may include delay cells having a smaller minimum unit of variable delays, and the number of bits of the delay control signal C_DL may be correspondingly increased.

At the time point t24, the coarse tuning section P_COA may be ended, and a fine tuning section P_FIN may be started. The switch control signal C_SW may be non-activated in the fine tuning section P_FIN, and thus, the second voltage V2 generated by the voltage generator 200 may be provided to the clock generator 400 as the control voltage VC. Accordingly, the control voltage VC may correspond to the second voltage V2, and the frequency f_OUT of CK_O may be adjusted by the loop including the phase detector 100, the voltage generator 200, the clock generator 400, and the divider 600. In the fine tuning section P_FIN, the controller 500 may maintain the delay control signal C_DL having the value X24 (the last adjusted value) corresponding to the fourth frequency f4. As illustrated in FIG. 2A, the second voltage V2 (and correspondingly the control voltage VC) may be changed after the time point t24, and varied up until the time point t25. A voltage V2' denotes a value of the second voltage V2 around the time point t25 that results in CK_O having the target frequency f_OUT'. At this time, the loop including the phase detector 100, the voltage generator 200, the clock generator 400, and the divider 600 may be locked.

At the time point t25, the fine tuning period P_FIN may end, and a lock period P_LOC may be started as a lock signal LOCK is activated. The switch control signal C_SW may be maintained in a non-activated state in the lock period P_LOC, and thus, the control voltage VC may be substantially V2'. in the lock period P_LOC, the controller 500 may maintain a value of the delay control signal C_DL as X24. A voltage difference ΔV between V1 and V2' in the lock period P_LOC may be dependent on a minimum unit of the delay provided by the delay cells included in the clock generator 400, similarly to the above-described frequency error Δf.

Figure 3:
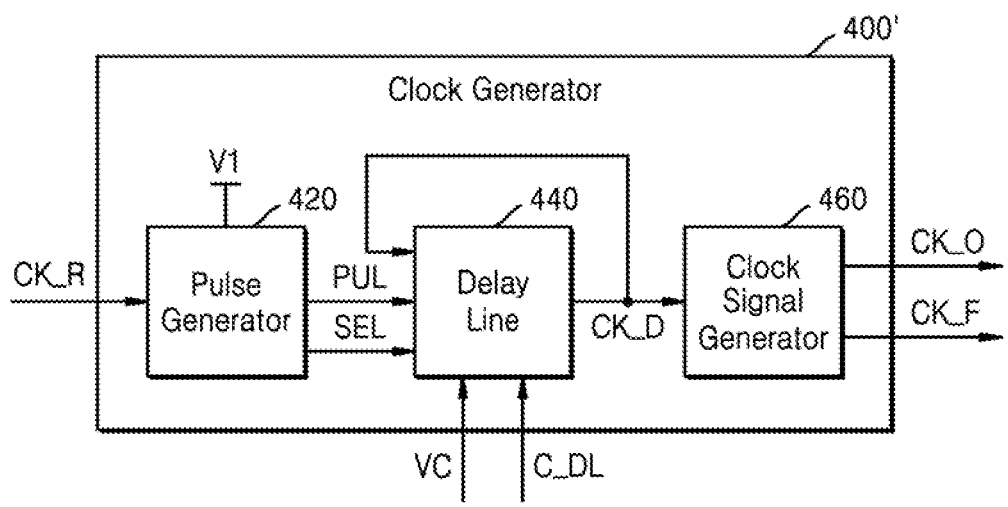
FIG. 3 is a block diagram of an example of a clock generator illustrated in FIG. 1, according to an example embodiment.

FIG. 3 is a block diagram of an example of the clock generator 400 of FIG. 1, according to an embodiment. As described above with reference to FIG. 1, a clock generator 400' of FIG. 3 may generate an output clock signal CK_O and a feedback clock signal CK_F having a frequency changed based on a control voltage VC and a delay control signal C_DL, and may receive a reference clock signal CK_R providing an edge injected into the output clock signal CK_O. Clock generator 400' may include a pulse generator 420, a delay line ("delay line circuit") 440, and a clock signal generator 460. The delay line 440 may include a series of delay cells forming a delay path. Briefly, the delay line 440 may periodically select, as an input signal to the delay path, a pulse signal PUL generated by the pulse generator 420 or a fed back portion of a "delay clock signal" CK_D which is a clock signal at an output of the delay path. The selection may be made based on a selection signal SEL generated by the pulse generator 420. The pulse generator 420 may generate the pulse signal PUL and the selection signal SEL from (or by using) the reference clock signal CK_R. The first voltage V1 may be received by the pulse generator 420, which may generate, using power driven by V1, the signals PUL and SEL which are used to inject the edge of CK_R. V1 may be a positive supply voltage of the pulse generator 420. The pulse signal PUL may include a pulse (e.g. an activation pulse) synchronized to the edge of CK_R, and the selection signal SEL may be activated in an "activation window", which is a time period that includes the pulse of PUL.

Noise may be generated during a process in which the pulse generator 420 generates the pulse signal PUL and the selection signal SEL; and the noise may be added to V1. Unlike the operations in the circuit of FIG. 3, if the pulse generator 420 were to receive power driven from the control voltage VC provided to the delay line 440, jitter of the delay clock signal CK_D generated by the delay line 440 may increase due to the noise caused by the pulse generator 420. On the other hand, as illustrated in FIG. 3, the first voltage V1 drives the pulse generator 420, and is separated from the delay line 440, to free the delay line 440 from the noise due to the pulse generator 420. An example operation of the pulse generator 420 will be described later with reference to FIGS. 4A and 4B.

The delay line 440 may receive the control voltage VC and the delay control signal C_DL; receive the pulse signal PUL and the selection signal SEL from the pulse generator 420; and receive feedback of the delay dock signal CK_D along the shown closed loop direct feedback path. (The "feedback" of CK_D may be understood as a signal that is a fed back portion of CK_D.) The delay line 440 may include delay ceils providing a delay that varies based on the control voltage VC and the delay control signal C_DL; and may generate CK_D by delaying the pulse of PUL or the fed back signal of CK_D based on the selection signal SEL. A period and a frequency of CK_D as an internal oscillation signal may be functions of the delay provided by the delay line 440. An example of the delay line 440 will be described later with reference to FIGS. 6A and 6B.

The clock signal generator 460 may receive the delay clock signal CK_D and may generate CK_O and the feedback clock signal CK_F synchronized to CK_D. In some embodiments, the clock signal generator 460 may generate CK_O and CK_F by dividing CK_D; and CK_O and CK_F may have the same frequency. While an edge injected from the pulse signal PUL may be included in CK_O. it may not be included in CK_F. In some embodiments, CK_O and CK_F may be mutually inverted, and while the edge injected as a rising edge (or a falling edge) may be included in CK_O, it may not be included in CK_F.

Figure 4A:
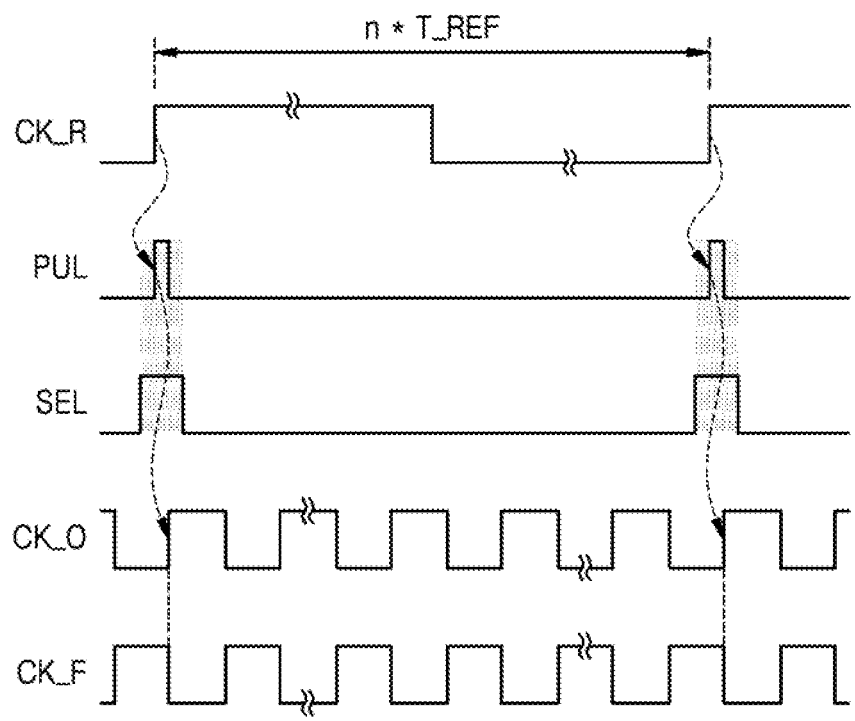
FIGS. 4A and 4B are timing diagrams of respective examples of an operation of a pulse generator illustrated in FIG. 3. according to example embodiments.
Figure 4B:
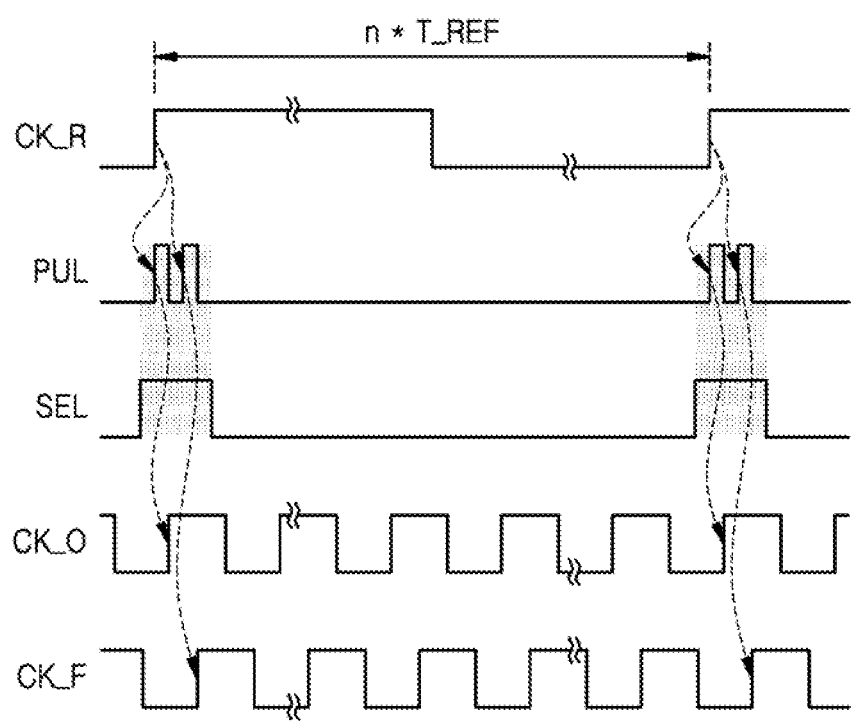

FIGS. 4A and 4B are timing diagrams of examples of an operation of the pulse generator 420 of FIG. 3, according to respective embodiments. In the example of FIG. 4A, the pulse signal PUL may include one pulse synchronized to the reference clock signal CK_R, and in the FIG. 4B example, the PUL may include two pulses synchronized to CK_R. Delays between signals may be omitted for convenience of illustration in FIGS. 4A and 4B. Referring to FIG. 4A, the pulse may be generated in the pulse signal PUL from a rising edge of the reference clock signal CK_R. The pulse of the PUL may be generated every period T_REF of the reference clock signal CK_R, or every two or more periods T_REF. That is, the pulse of PUL may be generated every n*T_REF, where n is a positive integer.

The selection signal SEL may be activated in a period (hereafter an "SEL window") that includes the pulse of the pulse signal PUL, and may be referred to as a window signal. An SEL pulse may be wider than the PUL pulse and may have pulse portions both preceding and succeeding the PUL pulse. As illustrated in FIG. 4A, an edge due to the PUL pulse may be injected into CK_O every period of "n*T_REF" in the SEL window. In the example of FIG. 4A, the edge due to the pulse of the pulse signal PUL may be injected into the feedback clock signal CK_F as a falling edge, but the divider 600 of FIG. 1 configured to receive the feedback clock signal CK_F and the phase detector 100 of FIG. 1 configured to receive the divided clock signal CK_FD may operate based on a rising edge of the feedback clock signal CK_F, and thus, effects due to the injected falling edge may be removed.

Referring to FIG. 4B, two pulses, that is, a preceding first pulse and a following second pulse, may be generated in the pulse signal PUL from the rising edge of the reference clock signal CK_R. The first pulse and the second pulse in the pulse signal PUL may be generated every period of n*T_REF.

The selection signal SEL may be activated in a period including the first pulse and the second pulse (the SEL activation window may include the first and second pulses). As illustrated in FIG. 4B, in the SEL window, a first edge due to the first pulse may be injected into CK_O, and a second edge due to the second pulse may be injected into CK_F. (In other embodiments, unlike the case of FIG. 4B, the edge due to the preceding first pulse may be injected into the feedback clock signal CK_F, and the edge due to the following second pulse may be injected into CK_O.) CK_O may have the edge injected every period of "n*T_REF," while CK_F may maintain the period such that the loop of FIG. 1 may be locked, regardless of the edge injected into CK_O. In some embodiments, the pulse generator 420 may include delay cells having the same structure as the delay cells included in the delay line 440, and thus, the second pulse may be delayed from the first pulse for a half of the period of CK_O.

Figure 5A:
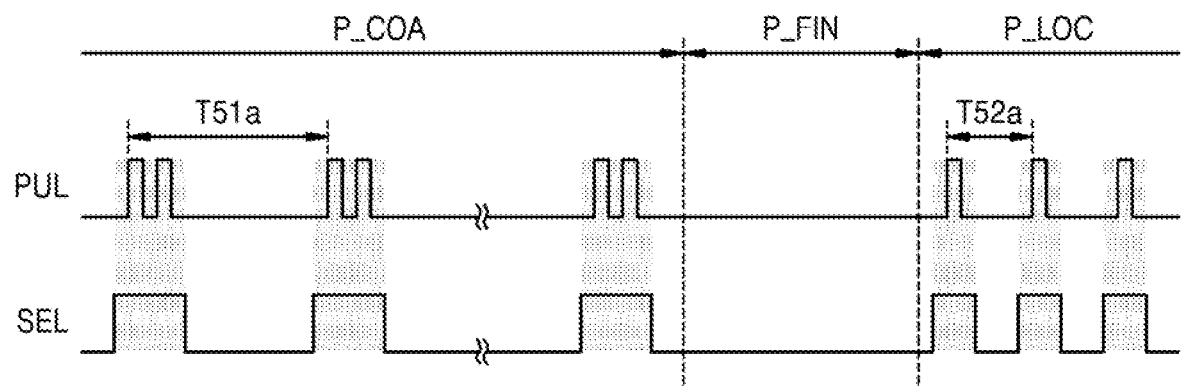
FIGS. 5A and 5B are timing diagrams of respective examples of an operation of the pulse generator illustrated in FIG. 3, according to example embodiments.
Figure 5B:
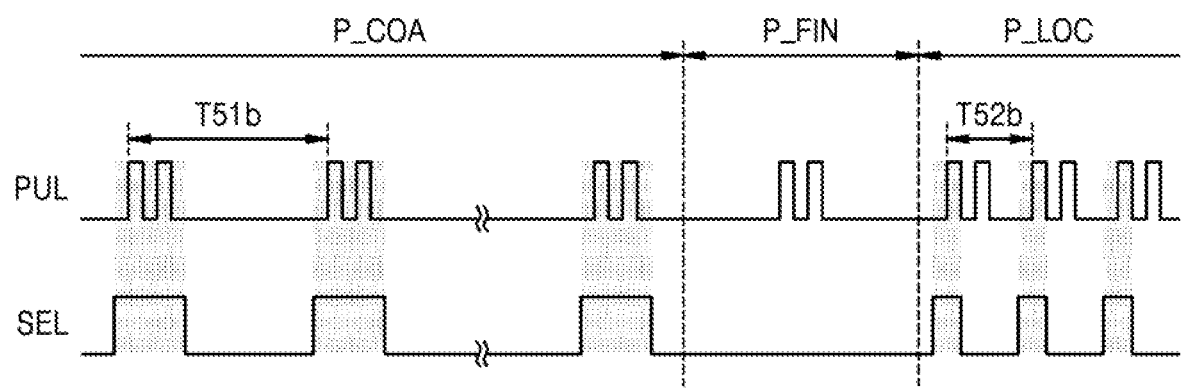

FIGS. 5A and 5B are timing diagrams of examples of an operation of the pulse generator 420 of FIG. 3, according to respective embodiments. In detail, FIGS. 5A and 5B show the examples of the operation of the pulse generator 420 configured to generate the pulse signal PUL including the first pulse and the second pulse as described above with reference to FIG. 4B, in the coarse tuning period P_COA, the fine tuning period P_FIN, and the lock period P_LOC. Hereinafter, FIGS. 5A and 5B will be described with reference to FIGS. 1 and 3, and redundant description will be omitted.

Referring to FIG. 5A, in the coarse tuning period P_COA, the pulse generator 420 may generate the pulse signal PUL including the two pulses (that is, the first pulse and the second pulse) generated every period T51a, and may generate the selection signal SEL activated in the period including the two pulses. In the fine tuning period P_FIN, the pulse generator 420 may generate the pulse signal PUL and the selection signal SEL that are non-activated. Accordingly, edge injection may not occur in the fine tuning period P_FIN. In some embodiments, the pulse generator 420 may receive the switch control signal C_SW from the controller 500, and may recognize the fine tuning period P_FIN via the switch control signal C_SW that is non-activated.

In the lock period P_LOC, the pulse generator 420 may generate the pulse signal PUL including one pulse and the selection signal SEL activated in a period including one pulse, as illustrated in FIG. 5A, so that only one pulse is periodically delayed via the delay line 440. The pulse of the pulse signal PUL may be generated every period T52a in the lock period P_LOC, and in some embodiments, the period T52a may be shorter than the period T51a. In some embodiments, the pulse generator 420 may receive the lock signal LOCK from the phase detector 100 and may recognize the lock period P_LOC via the activated lock signal LOCK.

Referring to FIG. 5B, in the coarse tuning period P_COA, the pulse generator 420 may generate the pulse signal PUL including two pulses generated every period T51b and may generate the selection signal SEL activated in a period including the two pulses. In the fine tuning period P_FIN. the pulse generator 420 may generate the pulse signal PUL including two pulses and may generate the selection signal SEL that is non-activated. Due to the non-activated selection signal SEL, edge injection may not occur in the fine tuning period P_FIN, despite the pulses of the pulse signal PUL.

In the lock period P_LOC, the pulse generator 420 may generate the pulse signal PUL including two pulses and the selection signal SEL activated in only a period including only one of the two pulses, as illustrated in FIG. 5B, so that only one pulse is periodically delayed via the delay line 440. The two pulses of the pulse signal PUL may be generated every period T52b in the lock period P_LOC. and in some embodiments, the period T52b may correspond to or may be shorter than the period T51b.

Figure 6A:
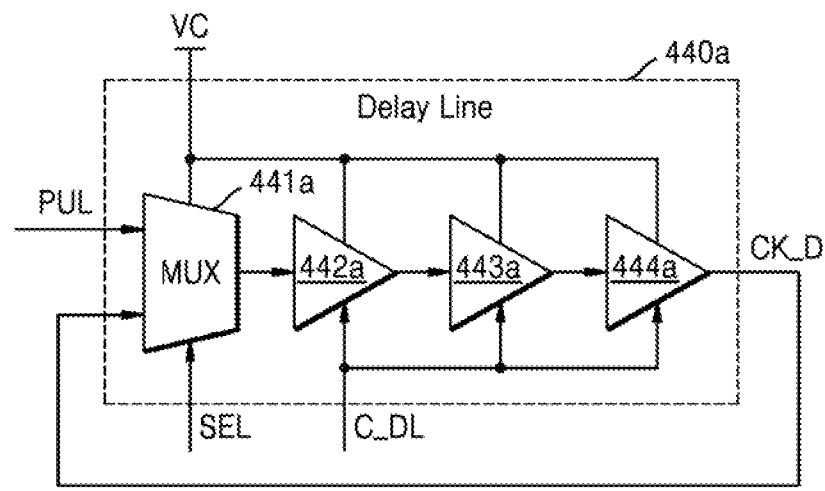
FIGS. 6A and 6B are block diagrams of respective examples of a delay line illustrated in FIG. 3, according to example embodiments.
Figure 6B:
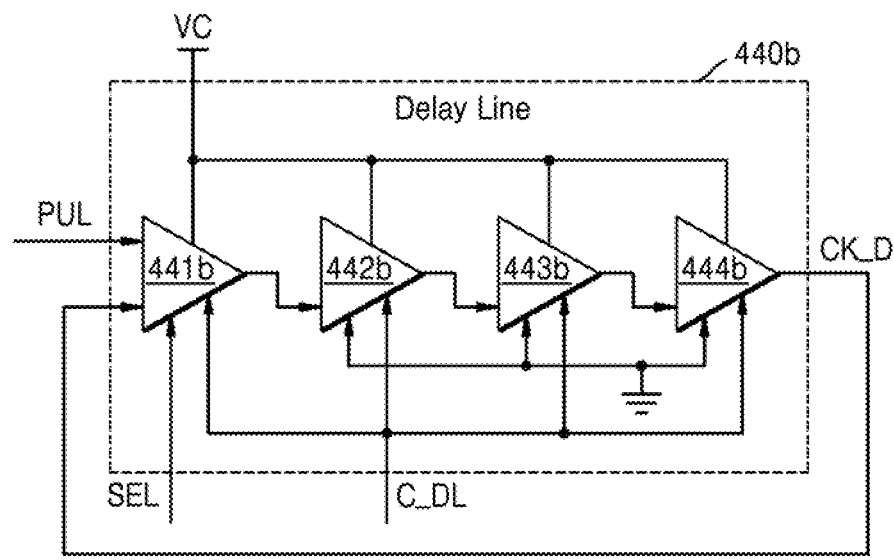

FIGS. 6A and 6B are block diagrams of respective examples of the delay line 440 of FIG. 3, according to embodiments. As described above with reference to FIG. 3, delay lines 440a and 440b of FIGS. 6A and 6B may receive the pulse signal PUL and the selection signal SEL from the pulse generator 420, and may receive the control voltage VC and the delay control signal C_DL. In various embodiments, the delay line 440 may include more or fewer delay cells than those illustrated in FIGS. 6A and 6B.

Referring to FIG. 6A, the delay line 440a may include a multiplexer 441a and a series of delay cells 442a, 443a, and 444a. The control voltage VC may be supplied to the multiplexer 441a and the series of delay cells 442a, 443a, and 444a, and may provide power as a positive supply voltage. A period, that is, a frequency, of the delay clock signal CK_D may be determined based on a delay provided by the multiplexer 441a and the series of delay cells 442a, 443a, and 444a.

The multiplexer 441a may output one of the pulse signal PUL and the delay clock signal CK_D based on the selection signal SEL, and the series of delay cells 442a, 443a, and 444a may generate the delay clock signal CK_D by delaying an output signal of the multiplexer 441a. In some embodiments, a delay of the output signal of the multiplexer 441a from the pulse signal PUL or the delay clock signal CK_D may decrease as the magnitude of the control voltage VC increases. The series of delay cells 442a, 443a, and 444a may provide the delay varying based on the control voltage VC and the delay control signal C_DL. For example, the series of delay cells 442a, 443a, and 444a may provide a delay decreasing as the magnitude of the control voltage VC increases.

Referring to FIG. 613, the delay line 440b may include a series of delay cells 441b, 442b, 443b, and 444b having the same structure. The control voltage VC may be supplied to the series of delay cells 441b, 442b, 443b, and 444b, and may provide power as a positive supply voltage. A period or a frequency of the delay clock signal CK_D may be determined, and controlled, based on a delay provided by the series of delay cells 441 b, 442b, 443b, and 444b.

The first delay cell 441b may output one of the pulse signal PUL and the delay clock signal CK_D based on the selection signal SEL. As illustrated in FIG. 6B, each of the second through fourth delay cells 442b, 443b, and 444b may receive an output signal of a preceding delay cell, via one input, and a reference voltage (e.g. ground voltage) may be applied to each of the second through fourth delay cells 442b, 443b, and 444b so that the received output signal is selected. The series of delay cells 441b, 442b, 443b, and 444b may generate an output signal by delaying an input signal based on the control voltage VC and the delay control signal C_DL. For example, the series of delay ceils 441b, 442b, 443b, and 444b may provide a delay decreasing as the magnitude of the control voltage VC increases.

Figure 7A:
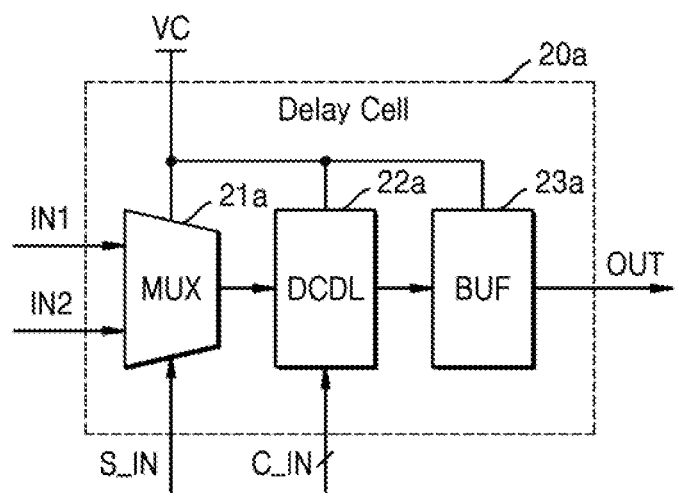
FIGS. 7A and 7B are block diagrams of respective examples of a delay cell, according to example embodiments.
Figure 7B:
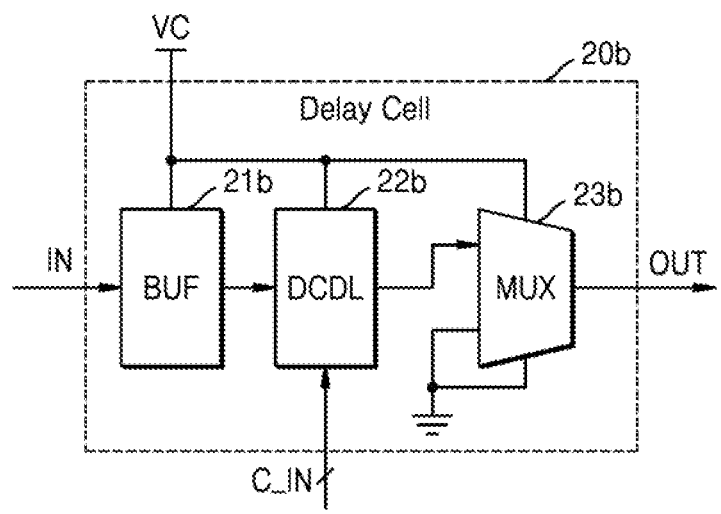

FIGS. 7A and 7B are block diagrams of respective examples of a delay cell according to embodiments. Referring to FIG. 7A, a delay cell 20a may include a multiplexer 21a, a digitally controlled delay line (DCDL) 22a, and a buffer 23a, to which power is supplied from a positive supply voltage, which may be the above-described control voltage VC. The multiplexer 21a may output, one of a first input IN1 and a second input IN2 based on a selection input S_IN. The DCDL 22a may delay an output signal of the multiplexer 21a based on a control input C_IN (which may be C_DL of FIG. 3). The DCDL 22a may have an arbitrary structure. For example, the DCDL 22a may internally generate a plurality of signals by differently delaying input signals, and may output one of the plurality of generated signals based on the control input C_IN. The buffer 23a may prevent reduction of the output signal of the DCDL 22a and may generate an output OUT. For example, the delay cell 20a may be used as the multiplexer 441a of FIG. 6A and the first delay cell 441b of FIG. 6B.

Referring to FIG. 7B, a delay cell 20b may include a buffer 21b, a DCDL 22b, and a multiplexer 23b, to which power is supplied from the positive supply voltage VC. Compared to the delay cell 20a of FIG. 7A, the delay cell 20b of FIG. 7B may have a flipped structure. When a preceding delay cell is the delay cell 20a of FIG. 7A, the delay cell 20b of FIG. 7B may be configured to have the same delay characteristic as the delay cell 20a of FIG. 7A. For example, the delay cell 20b may be used as the series of delay cells 442a, 443a, and 444a of FIG. 6A and the second through fourth delay cells 442b, 443b, and 444b of FIG. 6B.

Figure 8:
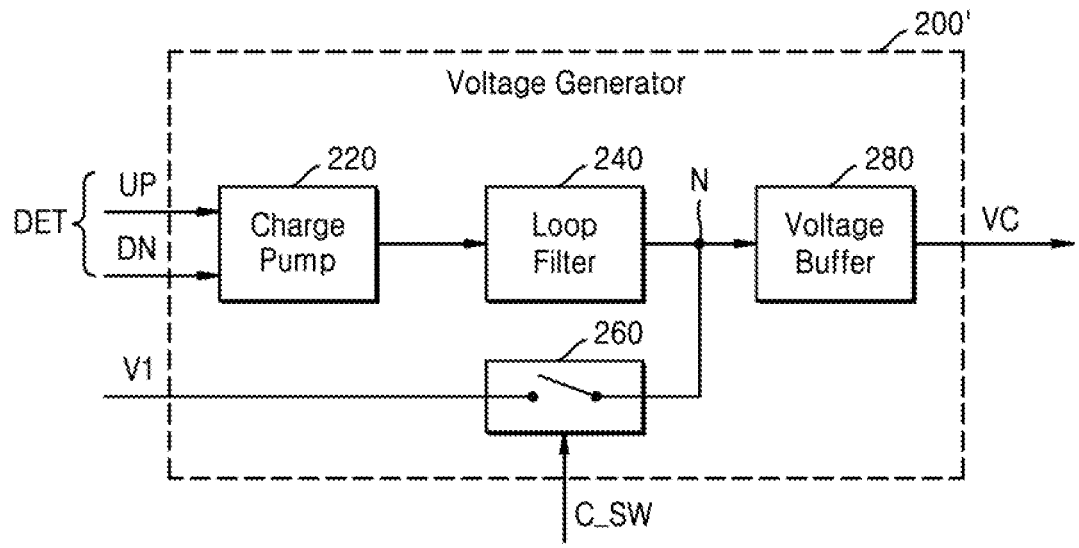
FIG. 8 is a block diagram of a voltage generator according to an example embodiment.

FIG. 8 is a block diagram of a voltage generator 200' according to an example embodiment. Compared to the example of FIG. 1, the voltage generator 200' of FIG. 8 may be considered to include a switch 260, which functions as the switch 300 of FIG. 1, and may output a control voltage VC. As illustrated in FIG. 8, the voltage generator 200' may include a charge pump 220, a loop filter 240, the switch 260, and a voltage buffer 280.

The charge pump 220 may receive an up signal UP and a down signal DN as a detection signal DET. The charge pump 220 may supply currents to the loop filter 240 based on the activated up signal UP, and may withdraw currents from the loop filter 240 based on the activated down signal DN. The loop filter 240 may include a discrete device, such as a capacitor, and may output a voltage to a node N based on the currents supplied or withdrawn from the charge pump 220.

The switch 260 may apply or block the first voltage V1 to or from the node N, via which the loop filter 240 outputs a voltage, based on the switch control signal C_SW received from the controller 500. V1 may be a positive supply voltage, and when the switch 260 is closed based on the switch control signal C_SW activated in the coarse tuning period P_COA, the node N may have the first voltage V1 due to the loop filter 240 having a relatively high output impedance. On the other hand, when the switch 260 is open based on the switch control signal C_SW non-activated in the fine tuning period P_FIN and the lock period P_LOC, the node N may have a voltage output by the loop filter 240; thus, in this condition the voltage of the node N may have the magnitude of the second voltage V2 based on the currents supplied or withdrawn from the charge pump 220. Since the loop filter has a high output impedance, the connection of switch 260 in FIG. 8 is effective to switch either the first voltage V1 or the second voltage V2 at the node N to the voltage buffer 280, akin to the switch 300 in FIG. 1. The voltage buffer 280 may generate the control voltage VC corresponding to or following the voltage of the node N, and may have a low output impedance. For example, the voltage buffer 280 may have a linear regulator, such as a low dropout (LDO) regulator.

Figure 9:
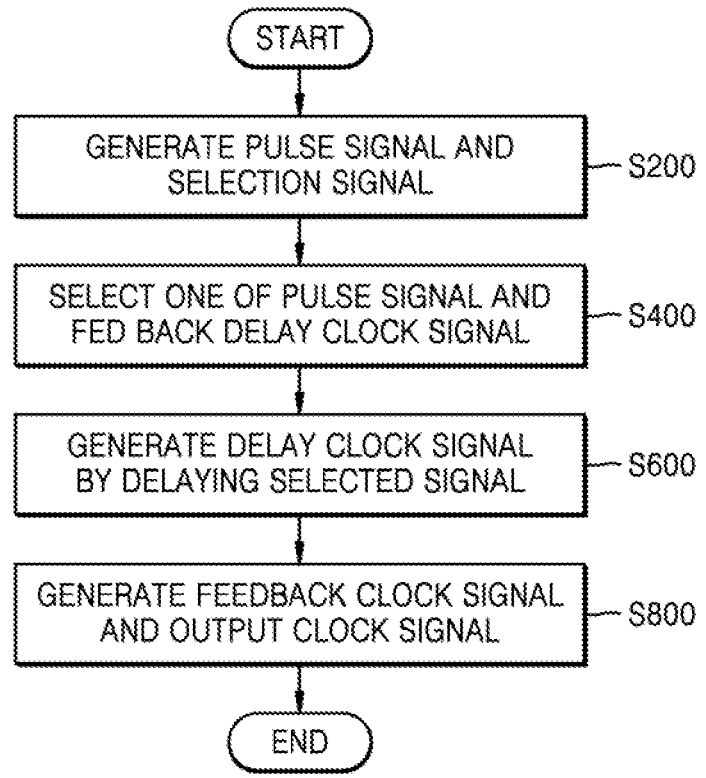
FIG. 9 is a flowchart of a method of generating a clock, according to an example embodiment.

FIG. 9 is a flowchart of a method of generating a clock, according to an example embodiment. For example, the method of FIG. 9 may be performed by a clock generator 400' of FIG. 3. Hereinafter, FIG. 9 will be described with reference to FIG. 3.

Referring to FIG. 9, in operation S200, an operation of generating the pulse signal PUL and the selection signal SEL may be performed. For example, the pulse generator 420 may generate the pulse signal PUL including at least one pulse synchronized to the reference clock signal CK_R, and may generate the selection signal SEL activated in a period including the pulse of the pulse signal PUL, as described above with reference to FIGS. 4A through 5B.

In operation S400, an operation of selecting one of the pulse signal PUL and the delay clock signal CK_D may be performed. For example, a multiplexer included in the delay line 440 may select one of the pulse signal PUL, and the delay clock signal CK_D fed back and input, based on the selection signal SEL.

In operation S600, an operation of generating the delay clock signal CK_D may be performed by delaying the selected signal. For example, the delay line 440 may generate the delay clock signal CK_D by delaying the signal selected based on the selection signal SEL. The generated delay clock signal CK_D may be fed back to the input of delay line 440, and may become a signal to be selected in operation S400. (Since CK_D may also be output from the delay line 440, when CK_D is said to be fed back to the input of the delay line 440, it is understood that "a portion of" CK_D is fed back.)

In operation S800, an operation of generating the feedback clock signal CK_F and the output clock signal CK_O may be performed. For example, the clock signal generator 460 may generate the feedback clock signal CK_F and the output clock signal CK_O by dividing, for example, the delay clock signal CK_D. An example of operation S800 will be described below with reference to FIG. 14.

Figure 10:
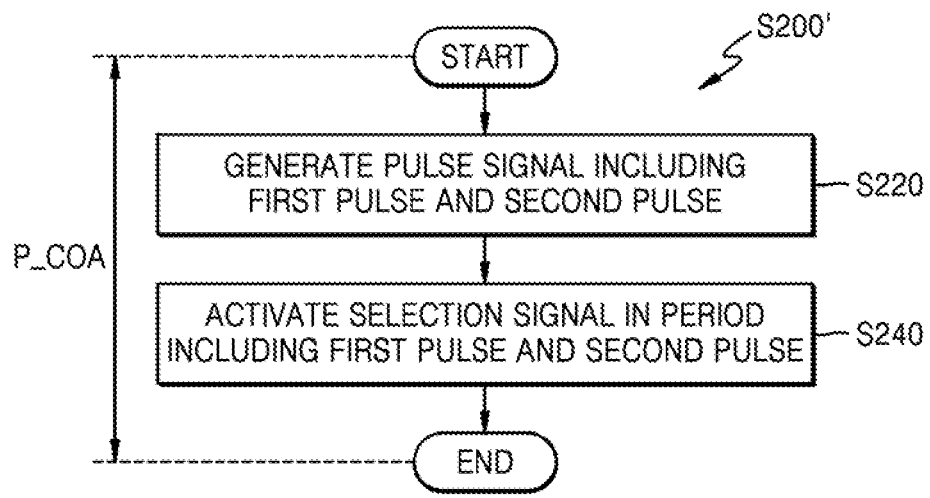
FIG. 10 is a flowchart of an example of operation S200 of FIG. 9, according to an example embodiment.

FIG. 10 is a flowchart of an operation, S200', which is an example of operation S200 of FIG. 9 in the coarse tuning period P_COA. For example, operation S200' may be performed by the pulse generator 420 of FIG. 3, and as illustrated in FIG. 10, operation S200' may include operations S220 and S240.

In operation S220, an operation of generating the pulse signal PUL including a first pulse and a second pulse may be performed. For example, as described above with reference to FIG. 4B, the pulse generator 420 may generate the pulse signal PUL including two pulses, that is, the first pulse and the second pulse, from an edge of the reference clock signal CK_R.

In operation S240, an operation of activating the selection signal SEL in a period including the first pulse and the second pulse may be performed. For example, as described above with reference to FIG. 4B, the pulse generator 420 may generate the selection signal SEL activated in the period including the first pulse and the second pulse. Accordingly, edges due to the first pulse and the second pulse may be periodically injected into the delay clock signal CK_D.

Figure 11:
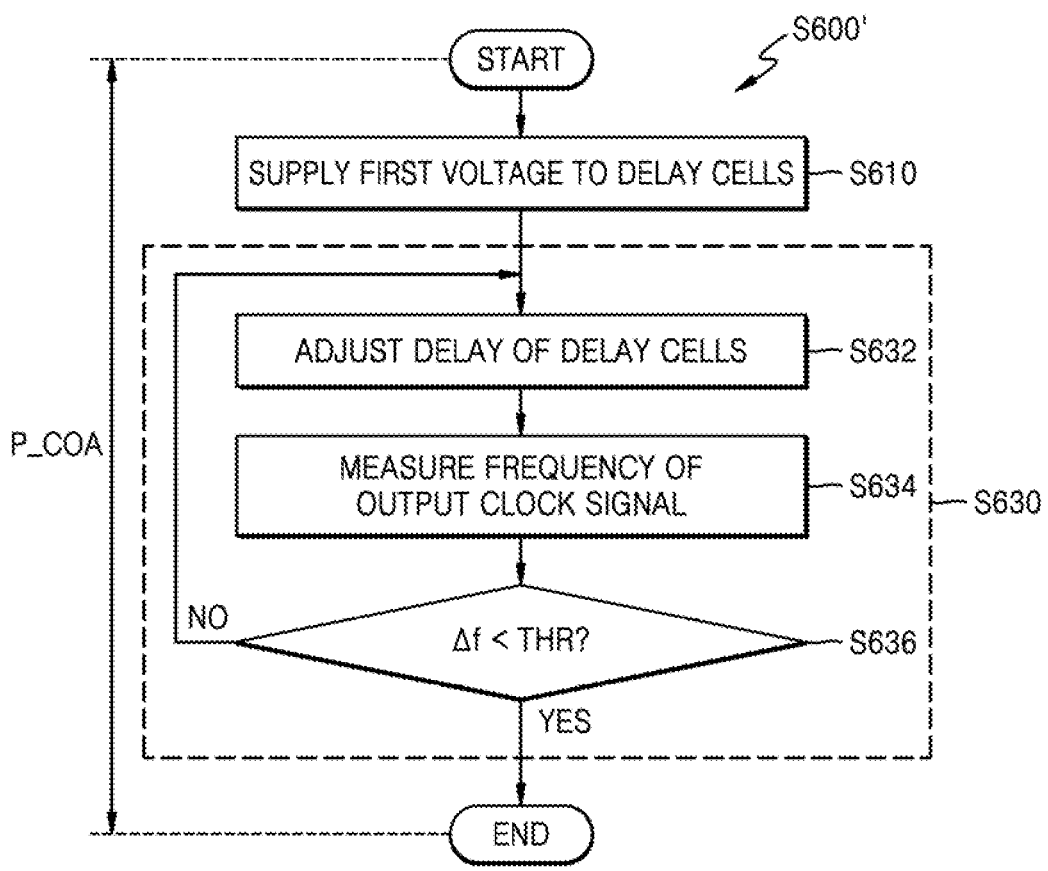
FIG. 11 is a flowchart of an example of operation S600 of FIG. 9, according to an example embodiment.

FIG. 11 is a flowchart of an example of an operation, S600', which is an example of operation S600 of FIG. 9 in the coarse tuning period P_COA. For example, operation S600' may be performed by the controller 500 of FIG. 1, and as illustrated in FIG. 11, operation S600' may include operations S610 and S630.

In operation S610, an operation of supplying the first voltage V1 to delay cells may be performed. For example, the controller 500 may control the switch 300 via the switch control signal C_SW such that the first voltage V1, which is a constant voltage, is supplied to the delay cells (for example, the delay line 440 of FIG. 3) included in the clock generator 400. V1 may be a positive supply voltage supplying power to the pulse generator (for example, 420 of FIG. 3) included in the clock generator 400.

In operation S630, an operation of adjusting a delay of the delay cells based on the frequency f_OUT of CK_O may be performed. As illustrated in FIG. 11, operation S630 may include operations S632, S634, and S636.

In operation S632, the operation of adjusting the delay of the delay cells may be performed. For example, the controller 500 may adjust the delay of the delay cells included In the clock generator 400 via the delay control signal C_DL. In some embodiments, the controller 500 may adjust the delay cells by using binary searching using a SAR.

In operation S634, an operation of measuring the frequency f_OUT of CK_O may be performed. For example, the controller 500 may include a counter, and may count edges of CK_O to measure the frequency f_OUT of CK_O. CK_O and the feedback clock signal CK_F may be internal oscillation signals of the clock generator 400, that is, signals synchronized to the delay clock signal CK_D, and thus, in some embodiments, the controller 500 may measure the frequency of the feedback clock signal CK_F, and in some embodiments, may measure the frequency of the delay clock signal CK_D.

In operation S636, an operation of determining whether a frequency error Δf between the frequency f_OUT of CK_F and a target frequency f_OUT' is less than a predetermined threshold value THR may be performed. That is, an operation of determining whether the frequency error Δf becomes within the predetermined range may be performed. As described above with reference to FIG. 2A, the threshold value THR may be determined based on a minimum delay unit provided by the delay cells included in the clock generator 400. When the frequency error Δf is less than the threshold value THR, the coarse tuning period P_COA may be ended, but when the frequency error Δf is not less than the threshold value THR, operation S632 may be performed next. In some embodiments, when the frequency of the feedback clock signal CK_F or the delay clock signal CK_D, rather than the frequency f_OUT of CK_O, is measured in operation S634, the target frequency to calculate the frequency error Δf in operation S636 may be different from the target frequency f_OUT' of CK_O and the threshold value may also be different from the threshold value THR.

Figure 12:
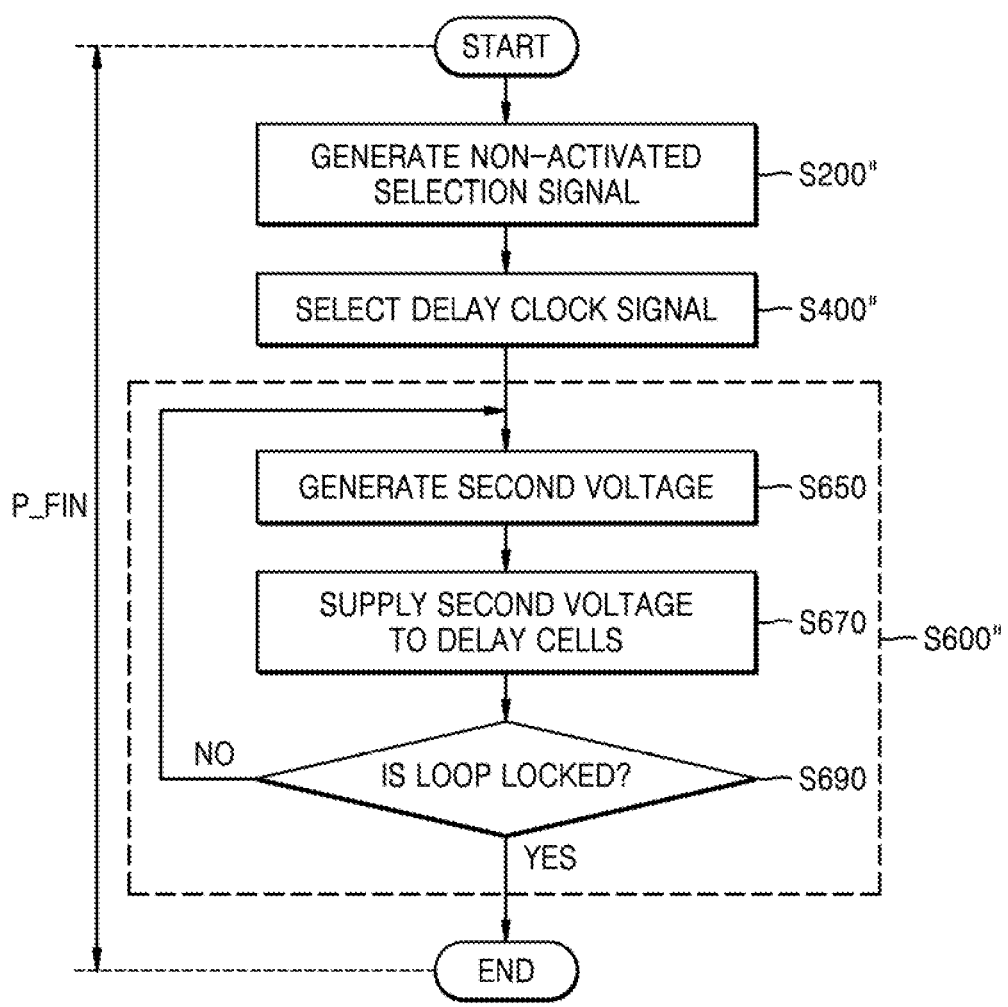
FIG. 12 is a flowchart of examples of operations S200, S400, and S600 of FIG. 9, according to an example embodiment.

FIG. 12 is a flowchart depicting operations, S200", S400", and S600", which are respective examples of operations S200, S400, and S600 of FIG. 9, in the fine tuning period P_FIN.

In operation S200", an operation of generating a non-activated selection signal SEL may be performed. For example, the pulse generator 420 may recognize the fine tuning section P_FIN based on the switch control signal C_SW, and may non-activate the selection signal SEL. Next, in operation S400", an operation of selecting the delay clock signal CK_D may be performed. For example, the delay line 440 may select the delay clock signal CK_D based on the non-activated selection signal SEL. Accordingly, edges may be prevented from being injected into the delay clock signal CK_D in the fine tuning period P_FIN.

In operation S600", as described above with reference to FIG. 9, an operation of generating the delay clock signal CK_D by delaying the selected signal may be performed, and as illustrated in FIG. 12, operation S600" may include operations S650, S670, and S690. In operation S650, an operation of generating the second voltage V2 may be performed. The second voltage V2 may be a voltage generated based on a phase difference between the reference clock signal CK_R and the divided clock signal CK_FD. (Since CK_FD is derived from CK_F which has a phase that may be referenced to CK_O or CK_D, the second voltage V2 may also be considered to be based on a phase difference between CK_R and any one of CK_F, CK_O or CK_D.) An example of operation S650 will be described below with reference to FIG. 13.

In operation S670, an operation of supplying the second voltage V2 to the delay cells may be performed. For example, the controller 500 may control the switch 300 via the switch control signal C_SW such that the second voltage V2 is supplied to the delay cells (for example, the delay line 440 of FIG. 3) included in the clock generator 400. Accordingly, the loop including the phase detector 100, the voltage generator 200, the clock generator 400. and the divider 600 of FIG. 1 may be formed.

In operation S690, an operation of determining whether the loop is locked may be performed. For example, when the loop is locked, the phase detector 100 may generate an activated lock signal LOCK. When the loop is locked, CK_O may have the target frequency f_OUT', and the fine tuning period P_FIN may be ended. On the other hand, when the loop is not locked, operations S650 and S670 may be repeated until the loop is locked.

Figure 13:
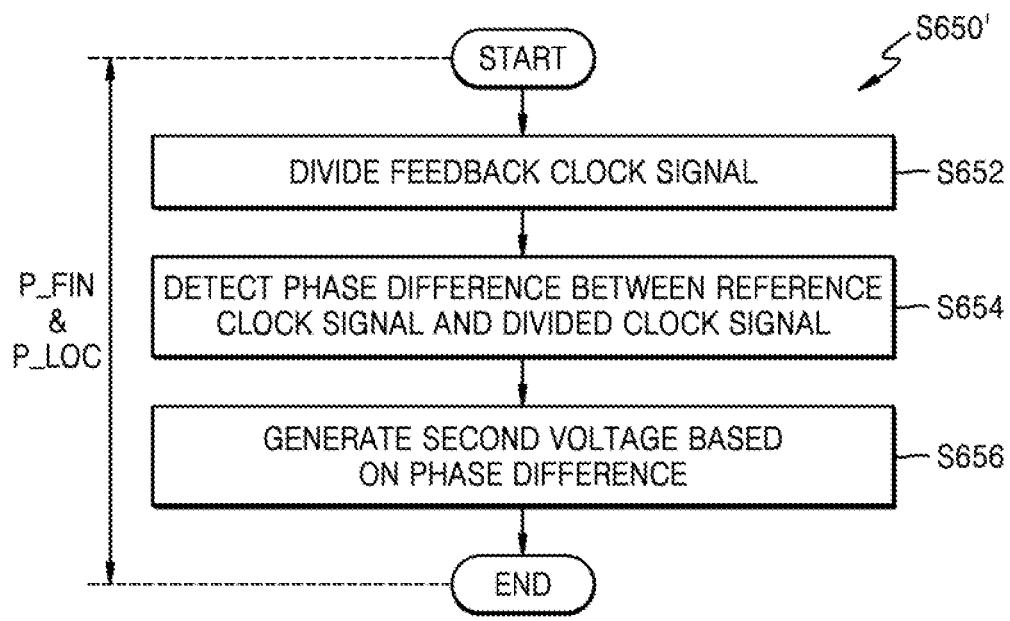
FIG. 13 is a flowchart of an example of operation S650 of FIG. 12, according to an example embodiment.

FIG. 13 is a flowchart of an operation, S650', which is an example of operation S650 of FIG. 12 In particular, operation S650' is an example operation for generating the second voltage V2 in the fine tuning period P_FIN and the lock period P_LOC. As illustrated in FIG. 13, operation S650' may include operations S652, S654, and S656. Hereinafter, operation S650' will be described with reference to FIG. 1.

In operation S652, an operation of dividing the feedback clock signal CK_F may be performed. For example, the divider 600 may generate the divided clock signal CK_FD by dividing the feedback clock signal CK_F received from the clock generator 400. A ratio of division of the divider 600 may be determined by the frequency of the reference clock signal CK_R and the target frequency f_OUT' of CK_O.

In operation S654, an operation of detecting a phase difference between the reference clock signal CK_R and the divided clock signal CK_FD may be performed. For example, the phase detector 100 may generate the detection signal DET by detecting the phase difference between the reference clock signal CK_R and the divided clock signal CK_FD, and the detection signal DET may indicate whether the divided clock signal CK_FD lags behind or is ahead of the reference clock signal CK_R.

In operation S656, an operation of generating the second voltage V2 based on the phase difference may be performed. For example, when the phase of the divided clock signal CK_FD is relatively lagging based on the detection signal DET of the phase detector 100, the voltage generator 200 may generate a rising second voltage V2, and when the phase of the divided clock signal CK_FD is relatively leading based on the detection signal DET of the phase detector 100, the voltage generator 200 may generate a falling second voltage V2.

Figure 14:
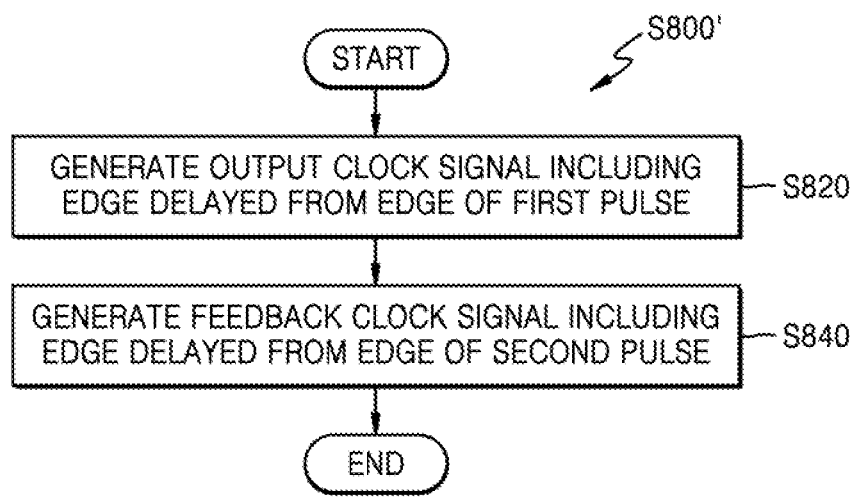
FIG. 14 is a flowchart of an example of operation S800 of FIG. 9, according to an example embodiment.

FIG. 14 is a flowchart of an example of operation S800 of FIG. 9, according to an embodiment. For example, operation S800' of FIG. 14 may be performed by the clock signal generator 460 of FIG. 3. As illustrated in FIG. 14, operation S800' may include operations S820 and S840, and in some embodiments, operations S820 and S840 may be performed in parallel.

In operation S820, an operation of generating the output clock signal CK_O including an edge delayed from an edge of the first pulse may be performed. For example, the pulse generator 420 may generate the pulse signal PUL including two pulses, that is, the first pulse and the second pulse, wherein the edge of the first pulse may be selected by the delay line 440 based on the selection signal SEL and may be delayed. The delay clock signal CK_D may include the delayed edge of the first pulse, and thus, the clock signal generator 460 may generate CK_O including the delayed edge of the first pulse that is included in tire delay clock signal CK_D. Accordingly, the edge of the first pulse may be injected into CK_O.

In operation S840, an operation of generating the feedback clock signal CK_F including an edge delayed from an edge of the second pulse may be performed. For example, the edge of the second pulse of tire pulse signal PUL generated by the pulse generator 420 may be selected by the delay line 440 based on the selection signal SEL and may be delayed. The delay clock signal CK_D may include the delayed edge of the second pulse, and thus, the clock signal generator 460 may generate the feedback clock signal CK_F including the delayed edge of the second pulse that is included in the delay clock signal CK_D.

Figure 15:
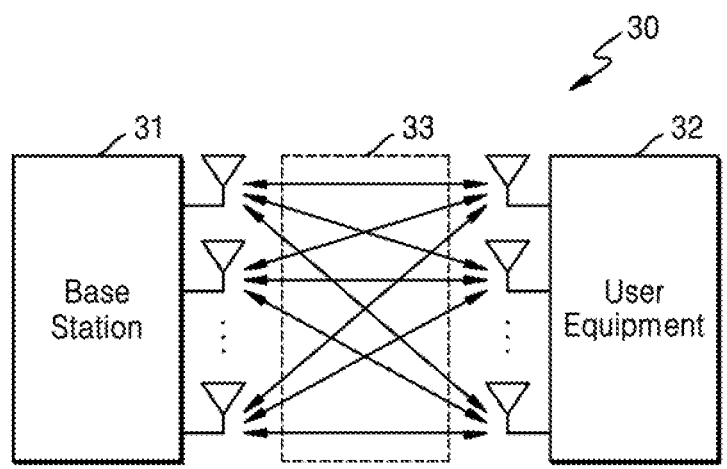
FIG. 15 is a block diagram of an example system with devices that may include a clock generation apparatus, according to an example embodiment.

FIG. 15 is a block diagram of an example system including devices that may include the clock generation apparatus 10 according to an example embodiment. An example is depicted in which a base station 31 and user equipment 32 perform wireless communication in a wireless communication system 30 using a cellular network. The wireless communication system 30 may define a high carrier wave frequency, and the base station 31 and the user equipment 32 may include the clock generation apparatus 10 providing excellent jitter characteristics, according to the example embodiments described above, and may accurately process signals in a high frequency range.

The base station 31 may be a fixed station communicating with user equipment and/or other base stations. For example, the base station 31 may be referred to as Node B, evolved-Node B (eNB), a sector, a site, a base transceiver system (BTS), an access point (AP), a relay node, a remote radio head (RRH), a radio unit (RU), a small cell, etc. The user equipment 32 may be fixed or mobile, and may transmit and receive data and/or control information by communicating with the base station 31. For example, the user equipment 32 may be referred to as terminal equipment, a mobile station (MS), a mobile terminal (MT), a user terminal (UT), a subscriber station (SS), a wireless device, a handheld device, etc. As illustrated in FIG. 15, each of the base station 31 and the user equipment 32 may include a plurality of antennas, and may perform wireless communication via a multiple input multiple output (MIMO) channel 33.

While the inventive concept has been particularly shown and described with reference to embodiments thereof, it will be understood that various changes in form and details may be made therein without departing from the spirit and scope of the inventive concept as defined by the following claims and their equivalents.

What is claimed is:

1. A clock generation apparatus comprising:
   a pulse generator configured to generate a pulse signal and a selection signal using a reference clock signal;
   a delay line circuit configured to select, as an input signal to a delay path, the pulse signal or a fed back portion of a delay clock signal at an output of the delay path, the selection being based on the selection signal, and thereby generate the delay clock signal;
   a switch configured to switch, based on a switch control signal, a first voltage or a second voltage to the delay line circuit for operation thereof, wherein the first voltage further provides power to the pulse generator, and the second voltage is generated based on a phase difference between the reference clock signal and the delay clock signal; and
   a controller configured to generate the switch control signal based on a frequency of the delay clock signal.

2. The clock generation apparatus of claim 1, wherein the delay path comprises a series of delay cells,
   each of the series of delay cells is configured to provide a delay varying based on a delay control signal, and
   the controller is further configured to generate the delay control signal based on the frequency of the delay clock signal.

3. The clock generation apparatus of claim 2, wherein while the first voltage is provided to the delay line circuit based on the switch control signal, the controller is configured to vary the delay control signal until a frequency error between the frequency of the delay clock signal and a target frequency falls within a pre-determined range.

4. The clock generation apparatus of claim 3, wherein the controller is further configured to generate the switch control signal such that second voltage is provided to the delay line circuit after the frequency error falls within the pre-determined range.

5. The clock generation apparatus of claim 4, wherein the pulse generator is further configured to generate the selection signal so that the delay line circuit selects the fed back portion of the delay clock signal after the frequency error falls within the pre-determined range.

6. The clock generation apparatus of claim 1, wherein the pulse generator is further configured to generate the pulse signal including a first pulse synchronized to an edge of the reference clock signal, and to generate the selection signal activated during a time period that includes the first pulse.

7. The clock generation apparatus of claim 6, wherein the pulse generator is further configured to generate the pulse signal including a second pulse synchronized to the edge of the reference clock signal, and wherein the time period during which the selection signal is activated further includes the second pulse.

8. The clock generation apparatus of claim 7, further comprising a clock signal generator configured to generate, from the delay clock signal, an output clock signal including an edge delayed from an edge of the first pulse and a feedback clock signal including an edge delayed from an edge of the second pulse.

9. The clock generation apparatus of claim 8, wherein the pulse generator is further configured to generate the pulse signal in which the second pulse is omitted, after the frequency of the delay clock signal equals a target frequency.

10. The clock generation apparatus of claim 8, wherein the pulse generator is further configured to generate the pulse signal non-activated during the time period including the second pulse, after a frequency of the delay clock signal has reached a target frequency.

11. The clock generation apparatus of claim 8, further comprising:
    a frequency divider configured to divide the feedback clock signal;
    a phase detector configured to detect a phase difference between the divided feedback clock signal and the reference clock signal; and
    a voltage generator configured to generate the second voltage based on the detected phase difference.

12. A clock generation apparatus comprising:
    a pulse generator configured to generate a pulse signal including an injection pulse synchronized to an edge of a reference clock signal;
    a delay line circuit comprising a series of delay cells each providing a delay varying based on a control voltage and a delay control signal, and configured to periodically delay the injection pulse to generate a delay clock signal; and
    a controller configured to:
       adjust the delay control signal until a frequency error between a frequency of the delay clock signal and a target frequency falls within a predetermined range in a time period in which the control voltage is a first voltage that also provides power to the pulse generator; and
       maintain the delay control signal at a last adjusted value during a time period in which the control voltage is a second voltage generated based on a phase difference between the reference clock signal and the delay clock signal, so that the frequency of the delay clock signal is further adjusted towards the target frequency.

13. The clock generation apparatus of claim 12, further comprising a switch configured to provide the first voltage or the second voltage to the delay line circuit as the control voltage, based on a switch control signal,
wherein the controller is further configured to generate the switch control signal based on the frequency of the delay clock signal.

14. A method of generating a clock, the method comprising:
generating a pulse signal and a selection signal using a reference clock signal;
selecting one of the pulse signal and a fed back portion of a delay clock signal based on the selection signal;
generating the delay clock signal by passing the selected signal through a series of delay cells;
in a coarse tuning period, providing a first voltage, which is a constant voltage, to the series of delay cells, and adjusting a delay of the series of delay cells until a frequency error between a frequency of the delay clock signal and a target frequency falls within a pre-determined range;
in a fine tuning period, generating a second voltage based on a phase difference between the reference clock signal and the delay clock signal, and providing the second voltage to the series of delay cells.

15. The method of claim 14, wherein the first voltage is also a voltage for providing power when generating the pulse signal and the selection signal.

16. The method of claim 14, wherein the generating of the pulse signal and the selection signal comprises:
generating, in the coarse tuning period, the pulse signal including a first pulse and a second pulse each synchronized to an edge of the reference clock signal; and
generating, in the coarse tuning period, the selection signal activated in a period including the first pulse and the second pulse.

17. The method of claim 16, wherein the generating of the pulse signal and the selection signal further comprises generating the pulse signal and the selection signal such that a period in which the selection signal is activated includes only the first pulse, after the fine tuning period has ended.

18. The method of claim 16, further comprising:
generating, from the delay clock signal, an output clock signal including an edge delayed from an edge of the first pulse; and
generating, from the delay clock signal, a feedback clock signal including an edge delayed from an edge of the second pulse.

19. The method of claim 18, wherein the generating of the second voltage comprises:
dividing the feedback clock signal;
detecting a phase difference between the divided feedback clock signal and the reference clock signal; and
generating the second voltage based on the detected phase difference.

20. The method of claim 14, wherein the generating of the pulse signal and the selection signal comprises generating, in the fine tuning period, the selection signal such that the fed back portion of the delay clock signal is continually selected throughout the fine tuning period.

21. The clock generation apparatus of claim 12, wherein the reference clock signal comprises a sequence of clock pulses and the pulse signal comprises pulses each having a duration shorter than each clock pulse of the reference clock signal.

22. The clock generation apparatus of claim 1, wherein:
the reference clock signal comprises a sequence of clock pulses;
the pulse signal comprises pulses each having a duration shorter than each clock pulse of the reference clock signal;
the selection signal comprises pulses each having a duration longer than each pulse of the pulse signal; and
the pulses of the pulse signal occur temporally within the pulses of the selection signal.

* * * * *